US010264678B1

(12) United States Patent
Zargar et al.

(10) Patent No.: US 10,264,678 B1
(45) Date of Patent: Apr. 16, 2019

(54) INTEGRATED AND FLEXIBLE BATTERY SECURING APPARATUS (71) Applicant: RFMicron, Inc., Austin, TX (US)

(72) Inventors: Tanmay Zargar, Austin, TX (US); Alan Wayne Hansford, Austin, TX (US)

(73) Assignee: RFMicron, Inc., Austin, TX (US)

( * ) Notice: Subject to any disclaimer, the term of this patent is extended or adjusted under 35 U.S.C. 154(b) by 0 days.

(21) Appl. No.: 16/011,404

(22) Filed: Jun. 18, 2018

Related U.S. Application Data (60) Provisional application No. 62/567,635, filed on Oct. 3, 2017.

(51) Int. Cl.
| H05K 1/18 | (2006.01) |
| H05K 1/02 | (2006.01) |
| H05K 1/11 | (2006.01) |
| G06K 19/07 | (2006.01) |
| G04G 17/04 | (2006.01) |
| G04G 19/00 | (2006.01) |
| G04G 17/06 | (2006.01) |
| H04B 1/40 | (2015.01) |

(52) U.S. Cl.
CPC ............. *H05K 1/181* (2013.01); *G04G 17/04* (2013.01); *G04G 19/00* (2013.01); *G06K 19/0723* (2013.01); *H05K 1/028* (2013.01); *H05K 1/111* (2013.01); *G04G 17/06* (2013.01); *H04B 1/40* (2013.01); *H05K 2201/056* (2013.01); *H05K 2201/10037* (2013.01)

(58) Field of Classification Search
CPC ...... H05K 1/18; H05K 1/02; H05K 2201/103; G06F 1/16; G06F 1/163; G06F 1/1626
USPC .................. 361/749–750, 775–784, 803; 174/254–262
See application file for complete search history.

(56) References Cited

U.S. PATENT DOCUMENTS

| 5,491,651 A * | 2/1996 | Janik ................... G06F 1/163 361/679.03 |
| 5,517,177 A * | 5/1996 | Cantrall ................ A45C 13/24 150/131 |
| 5,931,764 A * | 8/1999 | Freeman ................ G04G 9/00 361/679.03 |
| 6,307,751 B1 * | 10/2001 | Bodony .................. G06F 1/16 361/679.08 |

(Continued)

*Primary Examiner* — Tuan T Dinh
(74) *Attorney, Agent, or Firm* — Garlick & Markison; Timothy W. Markison; Timothy D. Taylor (57) ABSTRACT An electronic device includes a processing module, battery, input and/or output module, a first printed circuit board (PCB) section, a second PCB section and a flexible section. The first PCB section includes a mounting section for the processing module, a first battery connection for providing an electrical connection to a first terminal of the battery and a first mechanical coupling apparatus (MCA). The second PCB section includes a second battery connection for providing an electrical connection to a second terminal of the battery and a second MCA. The flexible section is coupled to the first and second PCBs, and when in a first position, the battery connections are not electrically coupled to a respective one of the terminals of the battery. When in a second position, the first MCA is mechanically coupled to the second MCA and the battery is electrically coupled to the first and second battery terminals.

18 Claims, 5 Drawing Sheets (56) References Cited

U.S. PATENT DOCUMENTS

| | | | |
|---|---|---|---|
| 8,958,201 B2 * | 2/2015 | Leung | G06F 1/1626 |
| | | | 361/679.27 |
| 2007/0211426 A1 * | 9/2007 | Clayton | H01L 23/473 |
| | | | 361/689 |

* cited by examiner

INTEGRATED AND FLEXIBLE BATTERY SECURING APPARATUS

CROSS REFERENCE TO RELATED PATENTS

The present U.S. Utility Patent Application claims priority pursuant to 35 U.S.C. § 119(e) to U.S. Provisional Application No. 62/567,635, entitled "INTEGRATED AND FLEXIBLE BATTERY SECURING APPARATUS", filed Oct. 3, 2017, which is hereby incorporated herein by reference in its entirety and made part of the present U.S. Utility Patent Application for all purposes.

BACKGROUND OF THE INVENTION

Technical Field of the Invention

This invention relates generally to battery powered devices and more particularly to mechanically and electrically connecting a battery to a circuit.

Description of Related Art

There is an almost endless list of battery-powered electrical devices. Some devices are larger requiring a significant amount of power and others are small requiring very little power. For small battery-powered electrical devices, a small battery is used (e.g., coin-shaped cell battery of various diameters and/or thicknesses). For example, a coin-shaped cell battery is used in digital watches, real time clocks, and a variety of active devices.

To secure the coin-shaped cell battery to a printed circuit board (PCB), the PCB includes a metal holder with one more metal clamps. The holder and clamp(s) provide mechanical and electrical coupling of the battery to the PCB.

DETAILED DESCRIPTION OF THE INVENTION

Figure 1:
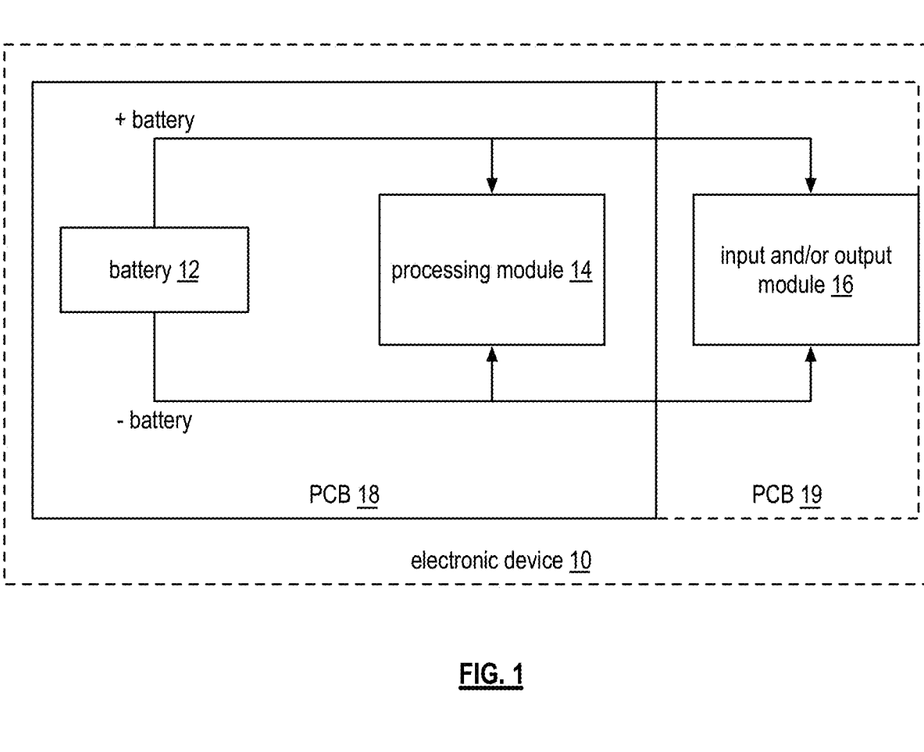
FIG. 1 is a schematic block diagram of an embodiment of a small electrical device in accordance with the present invention.

FIG. 1 is a schematic block diagram of an embodiment of an electrical device 10 that includes a processing module 14, an input and/or output module 16, a battery 12, and a printed circuit board (PCB) 18. The electronic device may be a digital watch, a disposable data-logger, an active radio frequency identification (RFID) tag, etc.

The electronic device 10 includes an input module and/or an output module 16. For example, for a digital watch, the input and/or output module includes a digital output module for display time functions, date functions, etc. As another example, for a disposable data-logger, the input and/or output module includes an input module for inputting data to the processing module.

The battery 12 and the processing module 14 are mounted on the PCB 18. The input and/or output module is mounted on the PCB 18, mounted on another PCB 18, or is mounted elsewhere within the electronic device 10. When the input and/or output module 16 is mounted on another PCB or is mounted elsewhere within the electronic device 10, the electronic device 10 further includes electrical connections (e.g., wires, busses, connectors, etc.) to electrically couple the input and/or output module 16 to the processing module 14.

In an embodiment, the PCB 18 includes two sections. The first PCB section includes a mounting section (e.g., electrical and mechanical) for the processing module 14, a first battery connection for providing an electrical connection to a first terminal (e.g., positive terminal) of the battery 12, and a first mechanical coupling apparatus (e.g., adhesive, clips, tabs, magnets, metalized film, hardware, etc.).

The second PCB section includes a second battery connection for providing an electrical connection to a second terminal (e.g., negative terminal) of the battery 12 and a second mechanical coupling apparatus. When the first mechanical coupling apparatus is mechanically coupled to the second mechanical coupling apparatus, the battery 12 is electrically coupled to the first and second battery terminals and is mechanically held in place between the first and second PCB sections.

In another embodiment, the PCB 18 includes two separate PCBs. The first PCB includes a mounting section for the processing module 14, a first battery connection for providing an electrical connection to a first terminal of the battery 12, and a first mechanical coupling apparatus. The second PCB includes a second battery connection for providing an electrical connection to a second terminal of the battery 12 and a second mechanical coupling apparatus. When the first mechanical coupling apparatus is mechanically coupled to the second mechanical coupling apparatus, the battery 12 is electrically coupled to the first and second battery terminals and is mechanically held in place between the first and second PCBs.

In another embodiment, the PCB 18 further includes a flexible section coupled to a first PCB and a second PCB such that when the flexible section is in a first flex position, the first and second PCBs are at a first distance, which allows for at least one of the first battery connection and the second battery connection to not be electrically coupled to a respective one of the first and second terminals of the battery.

When the flexible section is in a second flex position, the first and second PCBs are at a second distance, which allows the first mechanical coupling apparatus to be mechanically coupled to the second mechanical coupling apparatus, the battery to be electrically coupled to the first and second battery terminals and to be mechanically held in place between the first and second PCB sections. The flexible section is discussed in further detail with reference to FIGS. 3-6.

Note that the electronic device 10 may further include a communication circuit. For example, the electronic device 10 includes a wireless transceiver mounted on the PCB 18 and coupled to the processing module 14. As another example, the electronic device 10 includes a network connection circuit that is mounted on the PCB 18 and coupled to the processing module.

Figure 2:
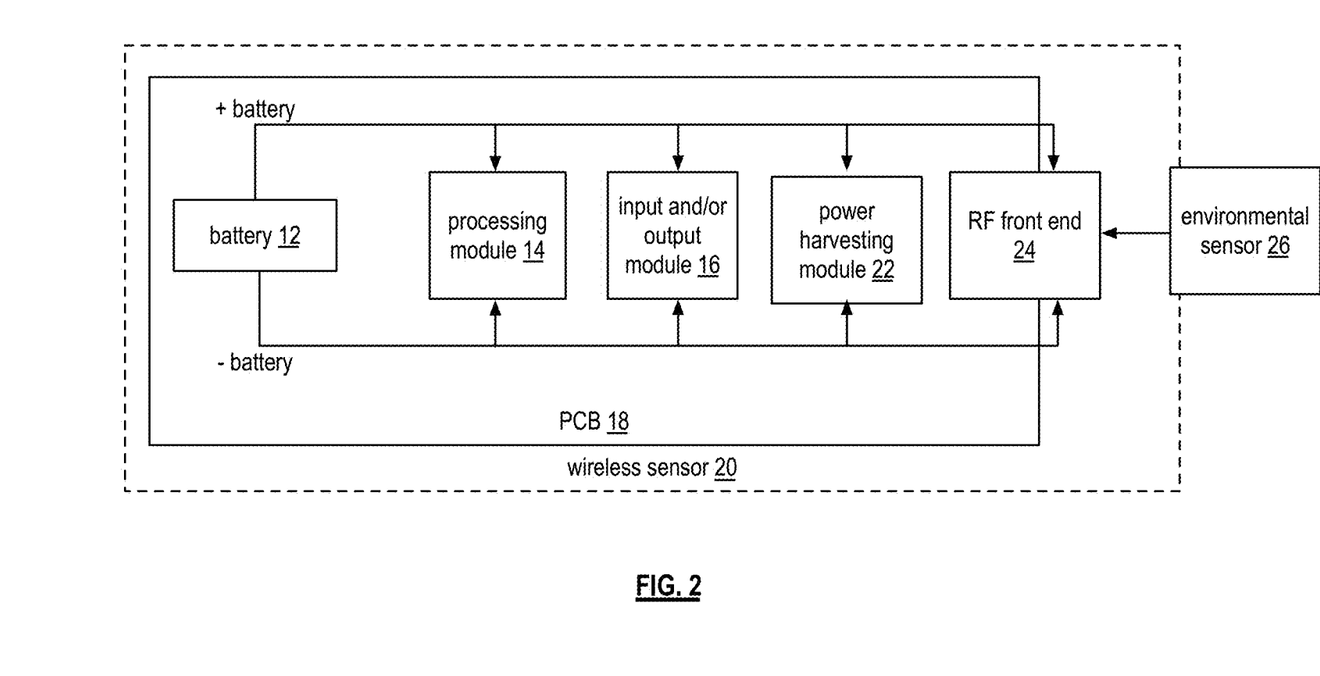
FIG. 2 is a schematic block diagram of an embodiment of a wireless sensor in accordance with the present invention.

FIG. 2 is a schematic block diagram of an example of a wireless sensor 20 that includes the battery 12, the processing module 14 and the input and/or output module 16 of FIG. 1, a power harvesting module 22, an RF front end 24, an environmental sensor 26 and a printed circuit board (PCB) 18. As one example, the wireless sensor 20 may be a radio frequency identification (RFID) tag. The wireless sensor 20 may include one or more PCBs 18 as discussed with reference to FIG. 1.

The wireless sensor 20 includes an input module and/or an output module 16. For example, for an instrument (e.g., guitar, piano, etc.) tuner, the input and/or output module 16 includes is a digital output module for displaying a pitch (e.g., frequency of sound), tuning functions (measured frequency with respect to desired frequency (e.g., a musical note)), etc. As another example, for a disposable data-logger, the input and/or output module includes an input module for inputting data to the processing module 14.

The battery 12, the power harvesting module 22, and the processing module 14 are mounted on the PCB 18. The input and/or output module 16 may be mounted on the PCB 18, mounted on another PCB, or may be mounted elsewhere within the wireless sensor 20. When the input and/or output module 16 is mounted on another PCB or is mounted elsewhere within the wireless sensor 20, the wireless sensor 20 further includes electrical connections (e.g., wires, busses, connectors, etc.) to electrically couple the input and/or output module 16 to the processing module 14.

The RF front end 24 is also mounted on the PCB or elsewhere in the wireless sensor 20. When the RF front end 24 is mounted on another PCB or is mounted elsewhere within the wireless sensor 20, the wireless sensor 20 further includes electrical connections (e.g., wires, busses, connectors, etc.) to electrically couple the RF front end 24 to the processing module 14.

The environmental sensor 26 may be located proximal to or within at least a portion of the wireless sensor 20 and is operably coupled to the RF front end 24. In an example, the environmental sensor 26 senses an environmental condition. The environment condition includes, but is not limited to, one or more of moisture, temperature, pressure, humidity, altitude, sonic wave (e.g., sound), human contact, surface conditions, tracking, location, etc. The environmental sensor 26 senses the environmental condition (e.g., moisture) and, as a result of the sensed condition, the environmental sensor affects an operational parameter (e.g., input impedance, quality factor, frequency, etc.) of the RF front end 24 of the wireless sensor 20. Note that the RF front end 24 includes one or more of an antenna, a tuning circuit, a tank circuit, a transmitter, and a receiver.

As a specific example, the environmental sensor 26, as a result of the sensed environmental condition, affects the input impedance of the RF front end 24 (e.g., the tank circuit that includes one or more capacitors and one or inductors having a resonant frequency corresponding to the carrier frequency of an RF signal). In response to the impedance change, the processing module 14 adjusts the resonant frequency of the RF front end 24 to compensate for the change in input impedance caused by the sensed environmental condition. The amount of adjustment is reflective of the level of the environmental condition (e.g., a little change corresponds to a little moisture; a large change corresponds to a large amount of moisture).

Figure 3:
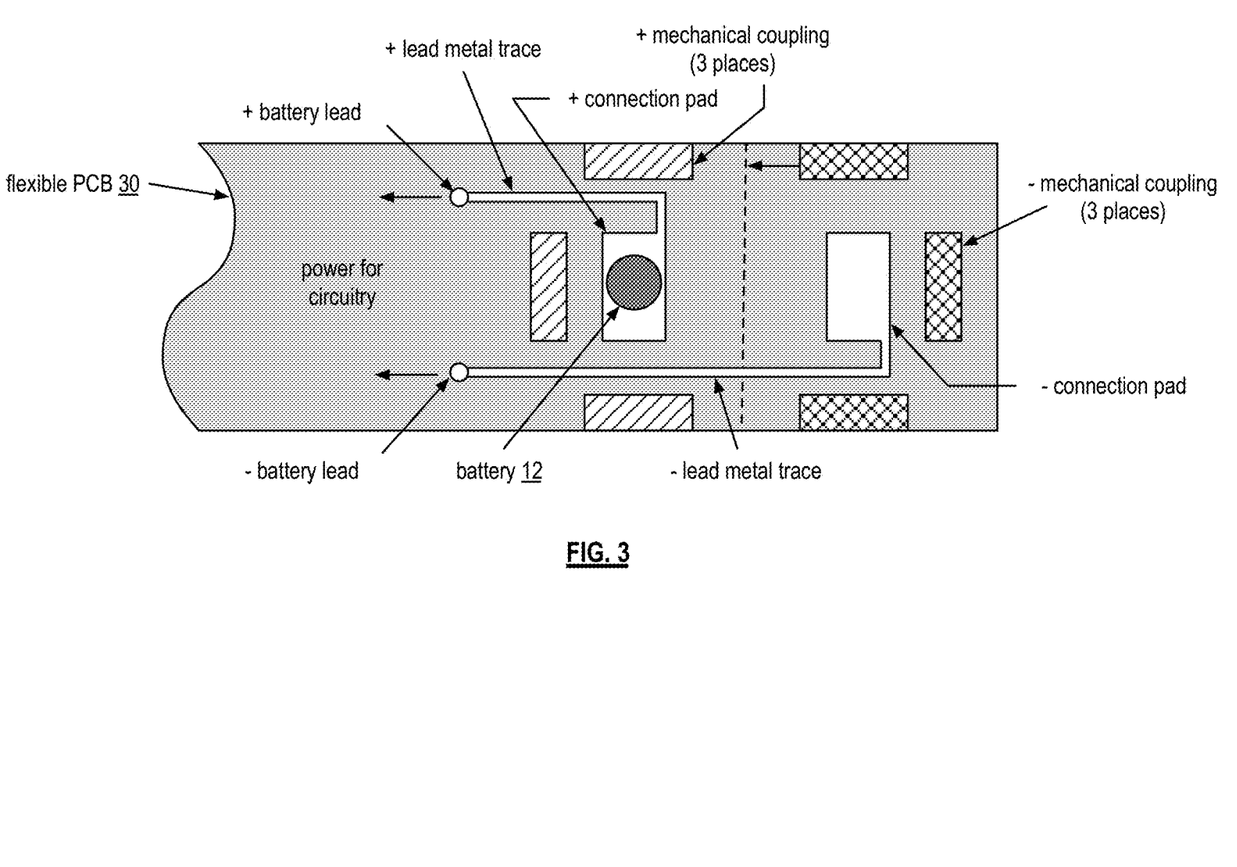
FIG. 3 is a schematic block diagram of an example of a flexible PCB in accordance with the present invention.

FIG. 3 is a schematic block diagram of an example of a flexible PCB 30 that has mounted thereon a positive (+) battery lead, a positive (+) lead metal trace, a positive (+) connection pad, a negative (−) battery lead, a negative (−) lead metal trace, and a negative (−) connection pad. The flexible PCB 30 further includes positive (+) mechanical coupling apparatus (shown in three places, but could be more or less places) and negative (−) mechanical coupling apparatus. A battery 12 is positioned on one of the + or − connection pad.

When the flexible PCB 30 is folded at the dotted line and the + and − mechanical coupling apparatus are mechanically coupled together, the battery 12 is held in place. Further, the battery 12 is pushed into the + and − connection pads to create an electrical connection there between.

Figure 4:
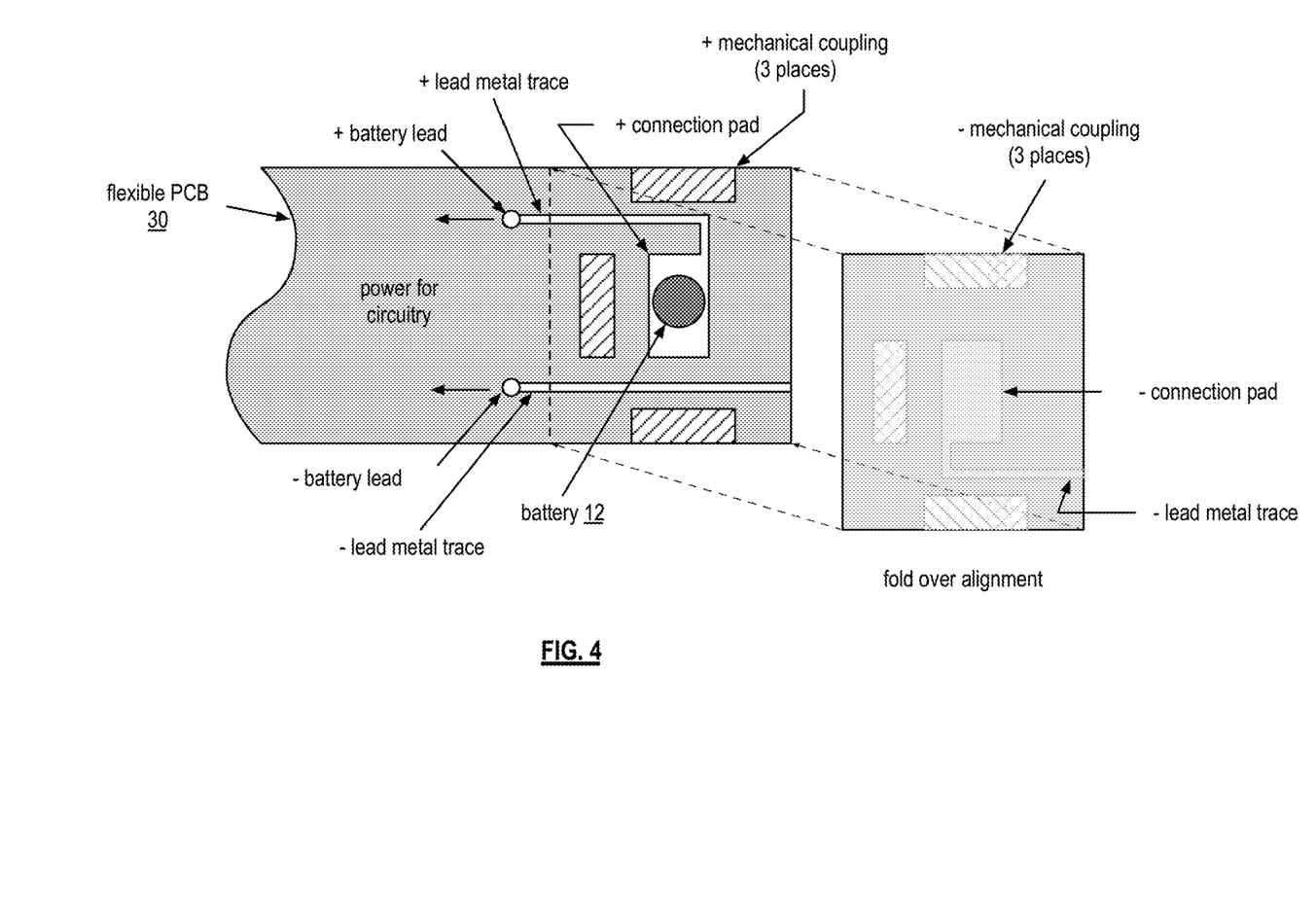
FIG. 4 is a schematic block diagram of another example of a flexible PCB in accordance with the present invention.

FIG. 4 is a schematic block diagram of another example of a flexible PCB 30 of FIG. 3 illustrating the alignment of the + mechanical coupling apparatus with the − mechanical coupling apparatus. The negative connection pad, the mechanical coupling apparatus, and the lead metal trace are shown from the backside of the PCB with respect to their depiction in FIG. 3.

Figure 5:
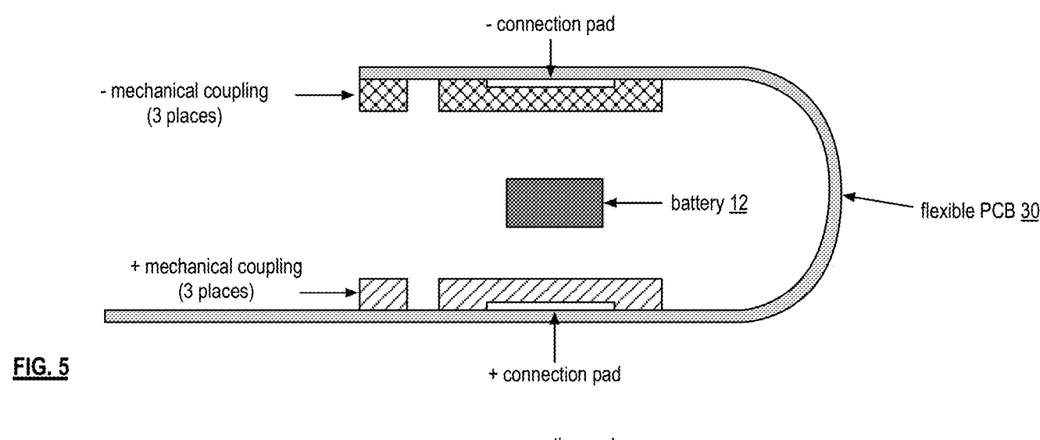
FIG. 5 is a schematic block diagram of another example of a flexible PCB in accordance with the present invention.

FIG. 5 is a schematic block diagram of another example of a flexible PCB 30 of FIG. 3 illustrating the alignment of the + mechanical coupling apparatus with the − mechanical coupling apparatus from a side view perspective with the sections aligned. The negative connection pad is aligned with the positive connection pad and the battery 12 is positioned there between. The negative mechanical coupling apparatus is aligned with the positive mechanical coupling apparatus.

Figure 6:
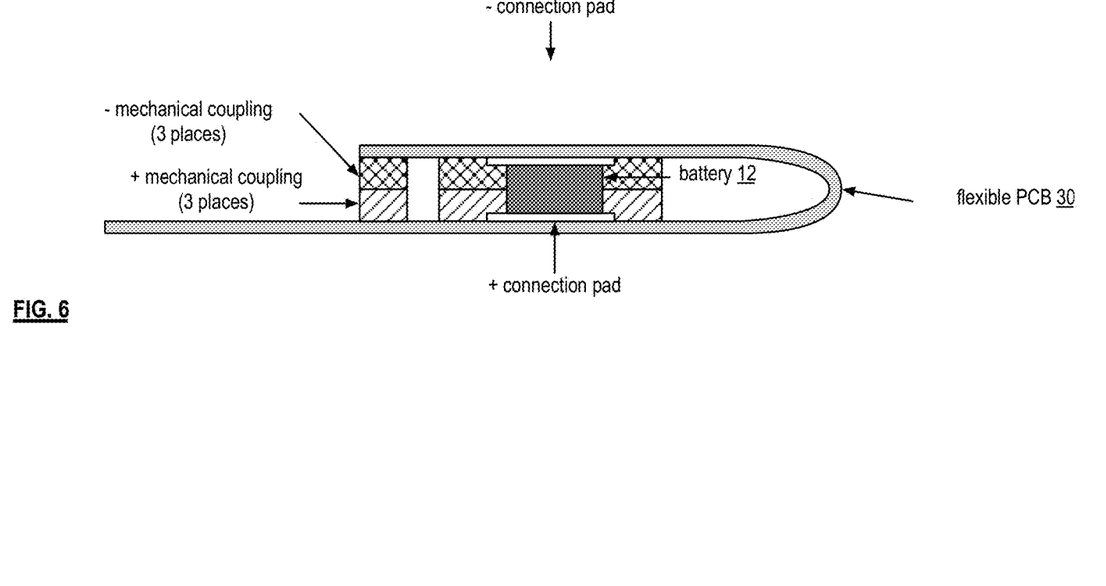
FIG. 6 is a schematic block diagram of another example of a flexible PCB in accordance with the present invention.

FIG. 6 is a schematic block diagram of another example of a flexible PCB 30 of FIG. 3 illustrating the alignment of the + mechanical coupling apparatus with the − mechanical coupling apparatus from a side view perspective with the sections mechanically coupled together. The negative connection pad and the positive connection pad are in electrical contact with the battery 12. The negative mechanical coupling apparatus is mechanically coupled to the positive mechanical coupling apparatus holding the battery 12 in place and maintaining the electrical connection between the connection pads and the battery 12.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. An electronic device comprises:
   a processing module;
   a battery;
   an input and/or output module operably coupled to the processing module;
   a first printed circuit board (PCB) section that includes:
      a mounting section for the processing module;
      a first battery connection for providing an electrical connection to a first terminal of the battery; and
      a first mechanical coupling apparatus;
   a second PCB section that includes:
      a second battery connection for providing an electrical connection to a second terminal of the battery; and
      a second mechanical coupling apparatus; and
   a flexible section coupled to the first PCB and the second PCB, wherein, when the flexible section is in a first flex position, the first and second PCBs are at a distance where at least one of the first battery connection and the second battery connection is not electrically coupled to the respective one of the first and second terminals of the battery, and wherein, when the flexible section is in a second flex position, the first mechanical coupling apparatus is mechanically coupled to the second mechanical coupling apparatus, the battery is electrically coupled to the first and second battery terminals and is mechanically held in place between the first and second PCB sections.

2. The electronic device of claim 1 further comprises:
   the first PCB section being a first section of a flexible PCB; and
   the second PCB section being a second section of the flexible PCB.

3. The electronic device of claim 1 further comprises:
   the first PCB section including a first PCB; and
   the second PCB section including a second PCB.

4. The electronic device of claim 1, wherein the first mechanical coupling apparatus includes one or more of:
   an adhesive;
   a clip;
   a tab;
   magnets;
   a metalized film; and
   other hardware.

5. The electronic device of claim 1, wherein the electronic device is one of:
   a digital watch;
   a disposable data-logger; and
   an active radio frequency identification (RFID) tag.

6. The electronic device of claim 5, wherein the digital watch includes the input and/or output module that is operable to display one of:
   display time functions; and
   date functions.

7. The electronic device of claim 5, wherein the data-logger includes the input and/or output module that is operable to input data to the processing module.

8. The electronic device of claim 1 further comprises:
   a communication circuit that includes one or more of:
   a receiver;
   a transmitter; and
   a network connection circuit.

9. A wireless sensor comprises:
   an environmental sensor;
   a radio frequency (RF) front end;
   a power harvesting circuit;
   a battery;
   an input/output module;
   a processing module operably coupled to the environmental sensor, the RF front end, the power harvesting circuit, the battery and the input/output module;
   a first printed circuit board (PCB) section that includes:
      a mounting section for the processing module;
      a first battery connection for providing an electrical connection to a first terminal of the battery; and
      a first mechanical coupling apparatus;
   a second PCB section that includes:
      a second battery connection for providing an electrical connection to a second terminal of the battery; and
      a second mechanical coupling apparatus; and
   a flexible section coupled to the first PCB and the second PCB, wherein, when the flexible section is in a first flex position, the first and second PCBs are at a distance where at least one of the first battery connection and the second battery connection is not electrically coupled to the respective one of the first and second terminals of the battery, and wherein, when the flexible section is in a second flex position, the first mechanical coupling apparatus is mechanically coupled to the second mechanical coupling apparatus, the battery is electrically coupled to the first and second battery terminals and is mechanically held in place between the first and second PCB sections.

10. The wireless sensor of claim 9 further comprises:
    the first PCB section being a first section of a flexible PCB; and
    the second PCB section being a second section of the flexible PCB.

11. The wireless sensor of claim 9 further comprises:
    the first PCB section including a first PCB; and
    the second PCB section including a second PCB.

12. The wireless sensor of claim 9, wherein the first mechanical coupling apparatus includes one or more of:
    an adhesive;
    a clip;
    a tab;
    magnets;
    a metalized film; and
    other hardware.

13. The wireless sensor of claim 9, wherein the wireless sensor is one of:

a digital watch;
an instrument tuner;
a disposable data-logger; and
an active radio frequency identification (RFID) tag.

14. The wireless sensor of claim 13, wherein the digital watch includes the input and/or output module that is operable to display one of:
   display time functions; and
   date functions.

15. The wireless sensor of claim 13, wherein the instrument tuner includes the input and/or output module that is operable to display one or more of:
   tuning functions; and
   measured frequencies.

16. The wireless sensor of claim 13, wherein the data-logger includes the input and/or output module that is operable to input data to the processing module.

17. The wireless sensor of claim 9, wherein the RF front end comprises one or more of:

a receiver;
a transmitter;
a tuning circuit; and
an antenna.

18. The wireless sensor of claim 9, wherein the environmental sensor is operable to determine one or more of:
   a moisture;
   a temperature;
   a pressure;
   a humidity;
   an altitude;
   a sonic wave;
   a human contact;
   a surface condition;
   a tracking; and
   a location.

* * * * *